(12) United States Patent
Voldman

(10) Patent No.: US 7,282,771 B2
(45) Date of Patent: Oct. 16, 2007

(54) STRUCTURE AND METHOD FOR LATCHUP SUPPRESSION

(75) Inventor: Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 10/905,878

(22) Filed: Jan. 25, 2005

(65) Prior Publication Data

US 2007/0215953 A1 Sep. 20, 2007

(51) Int. Cl.
*H01L 29/76* (2006.01)
(52) U.S. Cl. ..................................... 257/372
(58) Field of Classification Search ................. 257/372
See application file for complete search history.

(56) References Cited

U.S. PATENT DOCUMENTS

| | | | |
|---|---|---|---|
| 5,446,305 A | 8/1995 | Komori et al. | |
| 5,668,755 A | 9/1997 | Hidaka | |
| 5,880,503 A | 3/1999 | Matsumoto et al. | |
| 5,994,162 A | 11/1999 | Burghartz et al. | |
| 6,054,344 A | 4/2000 | Liang et al. | |
| 6,313,008 B1 * | 11/2001 | Leung et al. | 438/424 |
| 6,337,240 B1 | 1/2002 | Chu | |
| 6,352,887 B1 | 3/2002 | Hutter et al. | |
| 6,569,730 B2 * | 5/2003 | Tsai et al. | 438/234 |
| 6,642,583 B2 * | 11/2003 | Jimbo et al. | 257/372 |
| 2001/0011751 A1 | 8/2001 | Colombo et al | |
| 2001/0013610 A1 | 8/2001 | Chi et al | |
| 2002/0020881 A1 | 2/2002 | Okawa | |
| 2002/0135046 A1 * | 9/2002 | Yu | 257/579 |
| 2003/0218219 A1 | 11/2003 | Sohn | |
| 2005/0179111 A1 * | 8/2005 | Chao | 257/510 |

* cited by examiner

*Primary Examiner*—Wai-Sing Louie
*Assistant Examiner*—Mursalin B. Hafiz
(74) *Attorney, Agent, or Firm*—Anthony J. Canale; Greenblum & Bernstein, P.L.C.

(57) ABSTRACT

A method and structure for an integrated circuit comprising a substrate of a first polarity, a merged triple well region of a second polarity and a doped region of the second polarity abutting the well region. The doped region is adapted to suppress latch-up in the integrated circuit. The doped region is placed under semiconductor devices of the first polarity and under the well region contact region. Additionally, the structure may further include a deep trench (DT) structure and trench isolation (TI) structure to further improve latchup robustness.

18 Claims, 9 Drawing Sheets

STRUCTURE AND METHOD FOR LATCHUP SUPPRESSION

FIELD OF THE INVENTION

The invention generally relates to integrated circuits, and more particularly to a structure and device for providing latchup suppression in integrated circuits.

BACKGROUND OF THE INVENTION

Noise isolation and the elimination of complementary metal-oxide semiconductors (CMOS) latchup are significant issues in advanced CMOS technology, radio frequency (RF) CMOS, and bipolar CMOS (BiCMOS) Silicon Germanium (SiGe) technology. Latchup conditions typically occur within peripheral circuits or internal circuits, within one circuit (intra-circuit) or between multiple circuits (inter-circuit). In one such example, latchup occurs when a PNPN structure transitions from a low current high voltage state to a high current low voltage state through a negative resistance region (i.e., forming an S-Type I-V (current/voltage) characteristic).

In particular, latchup is known to be initiated by an equivalent circuit of a cross-coupled PNP and NPN transistor. With the base and collector regions being cross-coupled, current flows from one device leading to the initiation of the second device ("regenerative feedback"). These PNP and NPN elements can be any diffusions or implanted regions of other circuit elements (e.g., p-channel MOSFETs, n-channel MOSFETs, resistors, etc.) or actual pnp and npn bipolar transistors. In CMOS structures, the pnpn structure can be formed with a p-diffusion in a n-well, and a n-diffusion in a p-substrate ("parasitic PNPN"). In this case, the well and substrate regions are inherently involved in the latchup current exchange between regions in the device.

The condition for triggering a latchup is a function of the current gain of the PNP and NPN transistors, and the resistance between the emitter and the base regions. This inherently involves the well and substrate regions. The likelihood or sensitivity of a particular pnpn structure to latchup is a function of a same combination of spacing (e.g., base width of the NPN and base width of the PNP), current gain of the transistors, substrate resistance and spacings, the well resistance and spacings, and isolation regions.

Latchup can also occur as a result of the interaction of an electrostatic discharge (ESD) device, the input/output (I/O) off-chip driver and adjacent circuitry initiated in the substrate from the overshoot and undershoot phenomena. These factors can be generated by CMOS off-chip driver circuitry, receiver networks, and ESD devices. In CMOS I/O circuitry, undershoot and overshoot can lead to injection in the substrate, and simultaneous switching of circuitry where overshoot or undershoot injection occurs may lead to both noise injection and latchup conditions. Also, supporting elements in these circuits, such as pass transistors, resistor elements, test functions, over voltage dielectric limiting circuitry, bleed resistors, keeper networks and other elements can be present, contributing to noise injection into the substrate and latchup.

With the scaling of standard CMOS technology, the spacing of the p+/n+ space decreases, leading to a lower trigger condition and the onset of CMOS latchup. With the scaling of the shallow trench isolation (STI) for aspect ratio, the vulnerability of CMOS technology to latchup has increased. Vertical scaling of the wells, and lower n-well and p-well implant doses also has increased the lateral parasitic bipolar current gains, leading to lower latchup robustness.

With the transition from p+ substrates to low doped p− substrates, the latchup robustness has continued to decrease. Also, the effectiveness of n-wells as guard ring structures may reduce internal and external latchup problems. But, with mixed signal applications and radio frequency (RF) chips, a higher concern for noise reduction has lead to the continued lowering of the substrate doping concentration. This continues to lead to lower latchup immunity in mixed signal applications and RF technologies.

Latchup also can occur from voltage or current pulses that occur on the power supply lines. Transient pulses on power rails (e.g., substrate or wells) can trigger latchup processes. Latchup can also occur from a stimulus to the well or substrate external to the region of a thyristor structure from minority carriers.

Latchup can be initiated from internal or external stimulus, and is known to occur from single event upsets (SEU), which can include terrestrial emissions from nuclear processes, and cosmic ray events, as well as events in space environments. Cosmic ray particles can include proton, neutron, and gamma events, as well as a number of particles that enter the earth atmosphere. Terrestrial emissions from radioactive events, such as alpha particles, and other radio-active decay emissions can also lead to latchup in semiconductors.

For military, surveillance, satellite, and other outer space applications, it is desirable to have a high tolerance to latchup. Latchup can lead to failure of space applications triggered by cosmic rays, heavy ions, proton and neutron events. The higher the latchup margin in military and outer space applications, the higher the vulnerability to single even upset (SEU) initiated latchup.

SUMMARY OF THE INVENTION

In a first aspect of the invention, an integrated circuit includes a substrate of a first polarity, a well region of a second polarity in said substrate, a semiconductor device comprising at least one implant of the first polarity contained within said well region, an ohmic contact for said well region, and a dopant layer of the second polarity contained in the substrate, the dopant layer abutting the well region and placed under said semiconductor device, wherein said dopant layer is adapted to suppress latch-up.

A further exemplary embodiment of the invention provides a structure comprising a substrate of a first polarity, a well region of a second polarity in said substrate, a semiconductor device comprising at least one implant of the first polarity contained within said well region, an ohmic contact for said well region, a dopant layer of the second polarity contained in the substrate, the dopant layer abutting the well region and placed under said semiconductor device under the ohmic contact region, wherein said dopant layer is adapted to suppress latch-up and wherein the dopant layer and the well region of the second polarity provide an isolated region of the first polarity.

A further exemplary embodiment of the invention provides a method of forming a structure including providing a substrate of a first polarity, forming a well region of a second polarity containing a contact in said substrate, forming a semiconductor device in said well region, forming a doped region of the second polarity abutting the well region and placed under the semiconductor device, and forming a second well region of the first polarity using a second separate mask from the doped region, wherein said structure suppresses latchup.

BRIEF DESCRIPTION OF THE DRAWINGS

The above and other features and advantages of the invention will become more apparent to those of ordinary skill in the art by describing in detail exemplary embodiments thereof with reference to the attached drawings.

DETAILED DESCRIPTION OF EMBODIMENTS OF THE INVENTION

The embodiments of the invention and the various features and advantageous details thereof are explained more fully with reference to the non-limiting embodiments that are illustrated in the accompanying drawings and detailed in the following description. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

The invention places a doped region placed under a semiconductor device. This placement suppresses latch-up in the integrated circuit. This may also be used in connection with deep trench structures and trench isolation structures.

Figure 1:
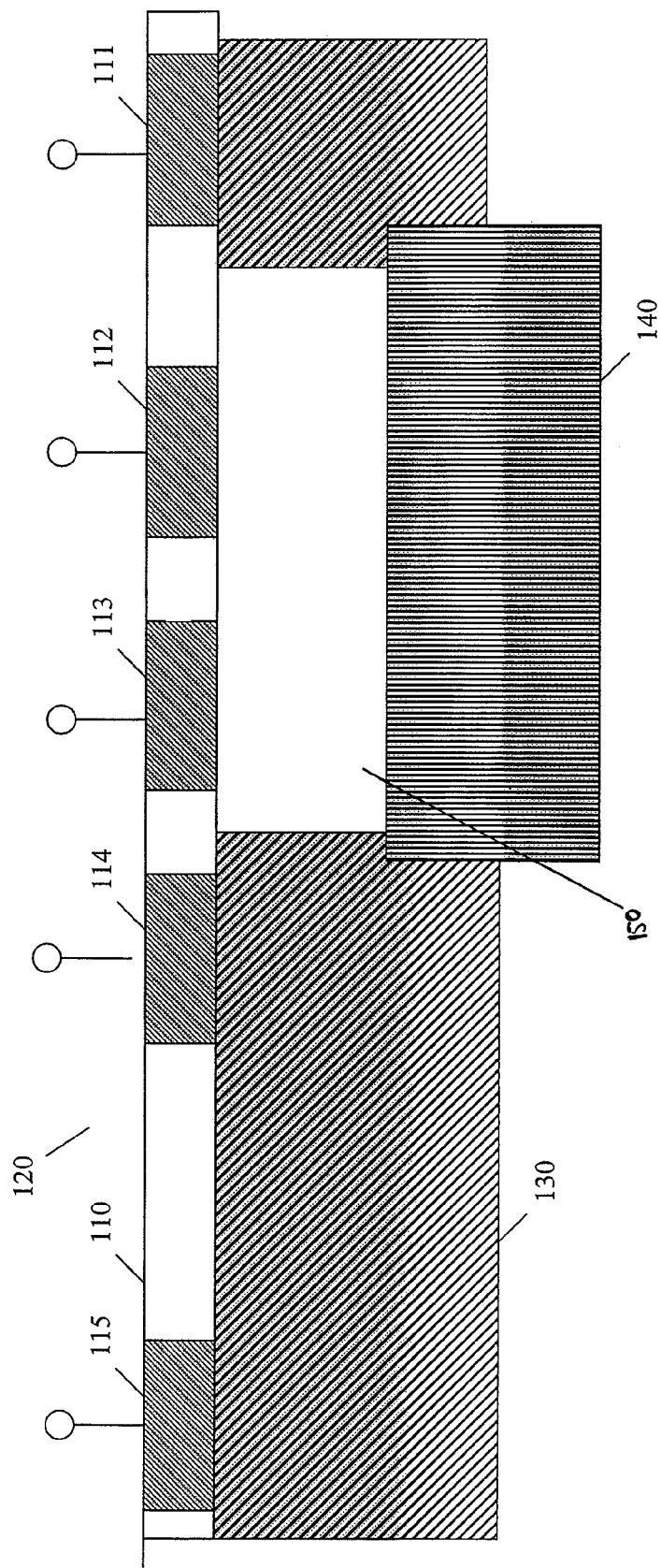
FIG. 1 illustrates a merged triple well structure.

FIG. 1 is a graphical illustration of a merged triple well structure. The triple well structure 100 includes a substrate 110 with a semiconductor device 120. An n+ well region 130 is provided below the semiconductor device 120 and an isolated doping layer 140 is provided adjacent the n+ well 130.

Still referring to FIG. 1, isolation structures define the N+ and the P+ region. Although the figures, including FIG. 1, show the N+ and P+ regions as having the same depth as the substrate 110, it is understood that the depth of the N+ and P+ regions may be shallower than the depth of the substrate 110. As illustrated, the P+ regions 112 and 114 represent any P+ diffusion. For example, the P+ diffusion may represent a LOCOS-defined P+/N− well diode, a P+ intrinsic N+ (PIN) diode, a PN base collector junction, a PN base collector varactor, a hyper-abrupt varactor (NAVAR), a polysilicon-bound PN diode, a Lubistor, a varactor, a Schottky diode, an STI− bound P+ diode, a P+ region of a Zener diode, a P+ resistor, or other component. By the way of example, the P+ region may be a physical P region which forms a metallurgical junction between the P region and the N region, thereby forming a diode.

The N+ regions 111, 113, and 115 may represent any N diffusion region. For example, the N+ region could be a varied resistor, an N diffusion resistor, a floating-gate tie down N+ diffusion or other component. Further, the N region may be the cathode structure corresponding to the anode structure—structure examples listed for the P+ regions 112 and 114. The N+ region forms a metallurgical junction between the input diffusion and the isolated doping region 140. The P+ region adjacent to the N+ region is the isolated region P+ contact to the isolated region 150.

FIG. 1 illustrates the N+ diffusion 111 as a ring. However, it is not mandatory that N+ diffusion region 111 be a ring shape, and the N+ diffusion may be in other shapes. As further illustrated, the isolated doping region 140 overlaps slightly with the N-well region 130. It should be recognized, though, that a problem common to the isolated doping region 140 is a scattering phenomenon associated with the edge transitions of the photo mask, i.e., the transition of the photo mask may lead to lateral ion "scattering". The scattering phenomenon, as well as the dopant, may impact the devices close to those physical regions.

For example, the P+ diffusion 114 in the N-well 130 has to be a certain distance from the edge of the isolated doping region 140 or it impacts the threshold voltage. In addition, the edge of the isolated doping region 140 also may influence the isolated well.

As shown in FIG. 1, there is a lateral bipolar formed between the P+ diffusion 112 and N+ region 113. There is also a lateral PNP, also referred to as a PNP transistor, formed by the P+ diffusion 114, the N-well 130 and the isolated doping region 140, and there is an NPN, also referred to as an NPN transistor, formed between the N+ diffusion region 113, the isolated doping region 140 and the N-well 130. This forms a PNPN because there is a PNP cross coupled with a NPN. As a result, the placement of the edge of the isolated doping region 140 may impact the functionality of the structure.

As further shown in FIG. 1, the P+ diffusion 114 is displaced from the edge of the isolated doping region 140, and the N+ diffusion 115 is also displaced from the edge. By way of example, the minimum spacing from the P+ diffusion 112 to the N+ diffusion 113 may be expanded from about one micron to a distance greater than one micron. There may be a distance about one micron between the edge of the isolated doping region 140 and the P+ region 114 and a distance of about one micron between the edge of the isolated doping region 140 and the N+ region 115. With current technology, the total spacing between the P+ diffusion 114 to the N+ diffusion 113 should be about 0.8 to 1.3 micron technology. However, in this implementation, avoiding the problems described above may cause the distance to increase to about 2.4 micron.

Placing the isolated doping region 140 underneath the N+ diffusion 113 introduces a vertical NPN. This increases the bipolar gain between the N+ diffusion 113 and the isolated doping region 140 because of the enhanced size of the collector structure. The N-well 130 and the isolated doping region 140 together forms a vertical and a lateral NPN. This increase in the gain of this bi-polar device may be on the order of three times, which may be detrimental. Further, the presence of the triple-walled structure leads to a degradation in the performance.

Figure 2:
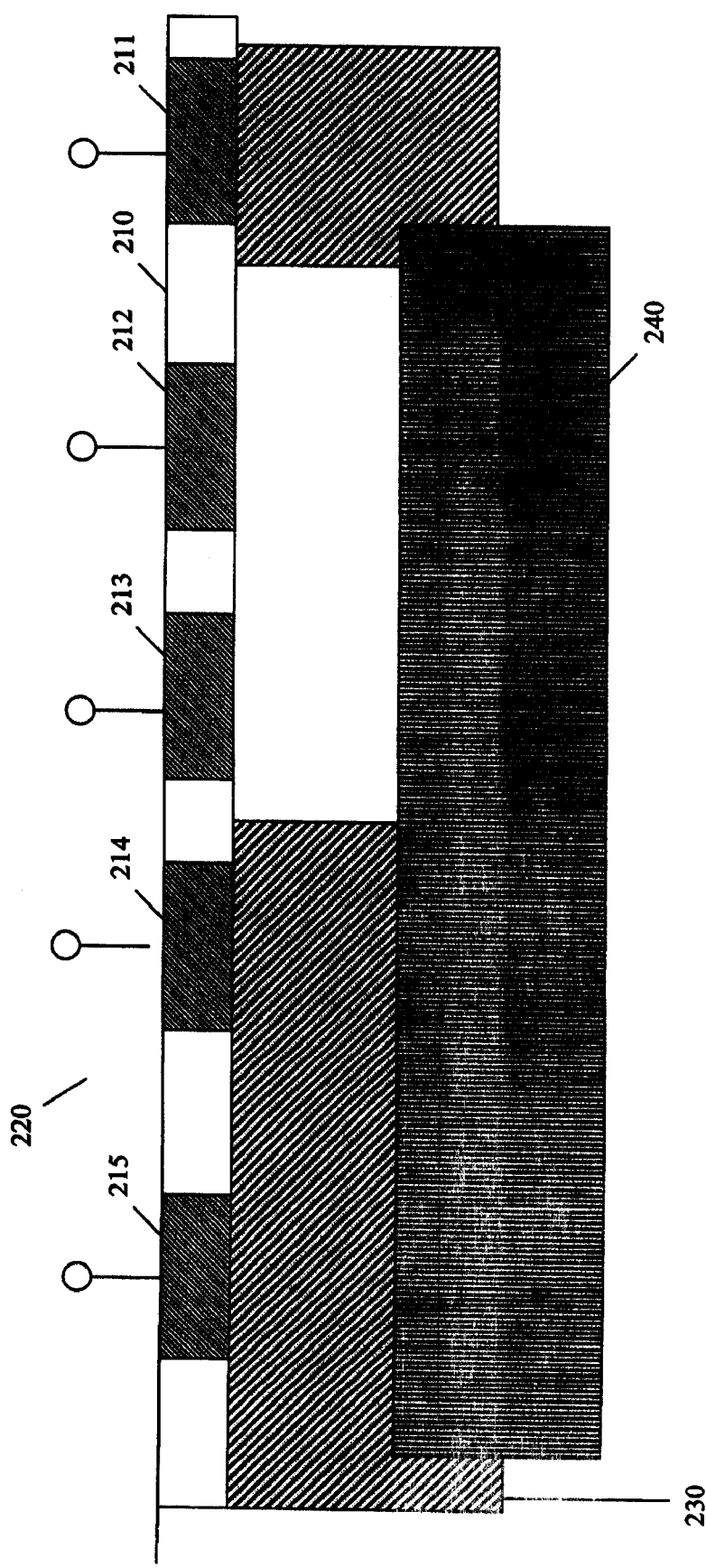
FIG. 2 illustrates a substrate having a buried isolated doping region placed under an N+ well according to an exemplary embodiment of the invention.

FIG. 2 illustrates a substrate having a buried isolated doping region placed under an N+ well according to an exemplary embodiment of the invention. In FIG. 2, an isolated doping region 240 is placed under the N-well region 230. In this implementation, there is no spacing issue between the P+ and the N+ regions associated with the edge of that isolated doping region 240 from scattering phenomenon.

FIG. 2 further shows the n+ well region 230 is provided below the semiconductor device 220 in the substrate 210. The isolation structures define the N+ and the P+ region of shelter and isolation. As illustrated, the P+ regions 212 and 214 represent any P+ diffusion such as, for example, a LOCOS-defined P+/N- well diode, an STI- bound P+ diode, a P+ region of a Zener diode, a P+ resistor, or other component, such as those described in reference to FIG. 1. By the way of example, the P+ region may be a physical P region which forms a metallurgical junction between that P region and the endwall structure, thereby forming a diode. The N+ regions 211, 213 and 215 may represent any N diffusion region such as, for example, a varied resistor, an N diffusion resistor, a floating-gate tie down N+ diffusion or other component, such as those described in reference to FIG. 1. The N+ region forms a metallurgical junction between the input diffusion and the isolated doping region 240.

Still referring to FIG. 2, placing the isolated doping region 240 underneath the P+ diffusion 214 results in a decrease of the vertical bi-polar current gain for the vertical PNP, as the effective base width of the vertical PNP has been increased. That is, there is a wider physical width between the metallurgical junction between the P+ region 214 and the N-well 230, and the N-well 230 to the substrate. The current that flows vertically can also go to the substrate and does not come back to the N+ diffusion region 215. The shunt resistance decreases which prevents forward biasing from occurring.

The N-well junction 230 sheet resistance has a certain sheet resistance by adding a second implant of the same polarity underneath the N+ diffusion 215, thereby decreasing the shunt resistance which is straddled across the P+ region 214 to the N-well junction 230. This prevents the forward biasing. As the isolated doping region 240 is placed under the N-well 230, the shunt resistance is reduced between the N-well 230 and the P+ diffusion device 214. This reduction in resistance changes the latchup conditions and provides significant enhancement.

Placing the edge of the isolated doping region 240 under the N-well structure 230 reduces or eliminates the scattering phenomenon from impacting the spacing of the P+ diffusion 214 to the N-well 230 and the N+ diffusion 215 to the N-well 230. Also, placing the edge of the isolated doping region 240 under this physical structure pushes the scattering out to another point in space and reduces the influence of the spacing requirements. In addition, the vertical bipolar gain is reduced or eliminated as a result of the increased base width and decreased bipolar current gain. Further, the shunt resistance is decreased or eliminated between the N- well 230 relative to the distance underneath the vertical PNP element.

Figure 3:
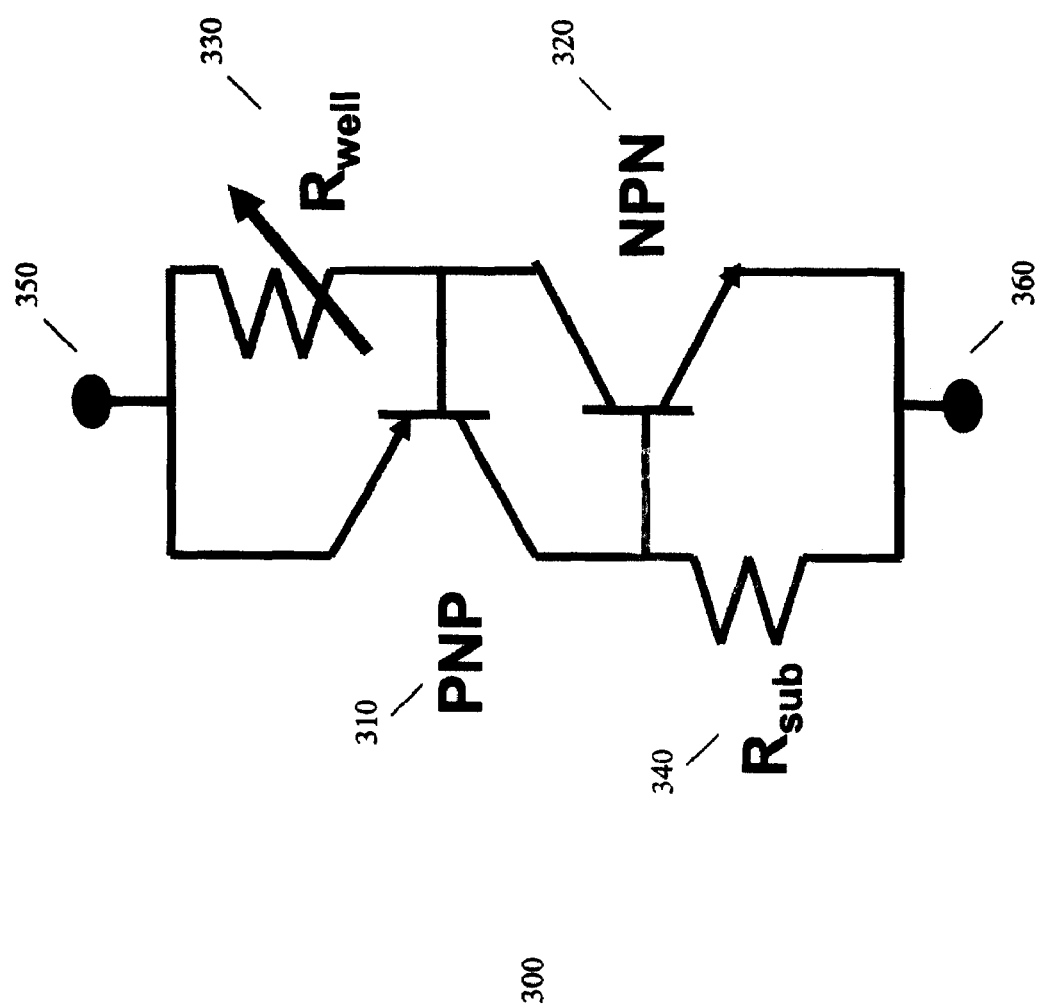
FIG. 3 illustrates an equivalent circuit schematic of buried isolated doping region placed under an N+ well according to an embodiment of the invention.

FIG. 3 illustrates an equivalent circuit schematic of an exemplary structure according to an embodiment of the invention. As shown, the equivalent circuit 300 has a PNP transistor 310, an NPN transistor 320, a variable well resistor 330, and a substrate resistor 340. The source of the PNP transistor 310 is connected to a voltage 350, while the drain PNP transistor 310 is connected to the substrate resistor 340 and the gate of the NPN transistor 320. The variable well resistor 330 is also connected to the voltage 350. The source of the well resistor 320 is connected to a ground 360 and the drain of the well resistor 320 is connected to the variable well resistor 330 and the gate of the PNP transistor 310. The substrate resistor 340 is connected to the ground 360. The well resistor 320 is the shunt resistance, so as the isolated doping layer is placed under the structure, the shunt resistance is in parallel with the PNP parasitic transistor. As that resistance decreases, it is less likely to forward bias the PNP, thereby preventing the PNP from going into forward active states. The NPN remains unchanged.

Figure 4:
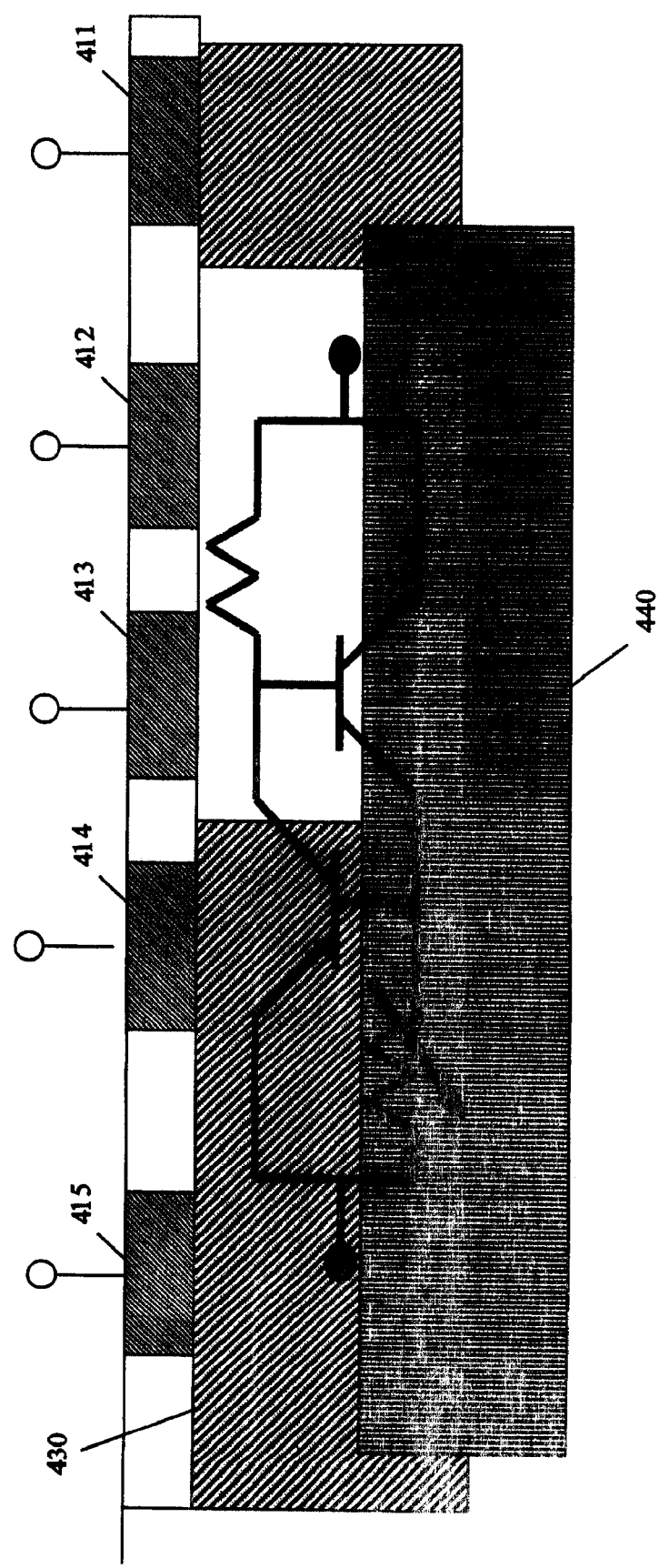
FIG. 4 illustrates the equivalent circuit of FIG. 3 superimposed on a physical structure.

FIG. 4 shows the equivalent circuit of FIG. 3 superimposed on a physical structure. P+ diffusions 412 and 414, N+ diffusions 411, 413 and 415, N-well 430 and isolating doping region 440 have similar properties to those described previously. The presence of the buried layer increases the bipolar gain vertically. Placing the isolated doping region under the physical structure reduces the PNP gain.

Figure 5:
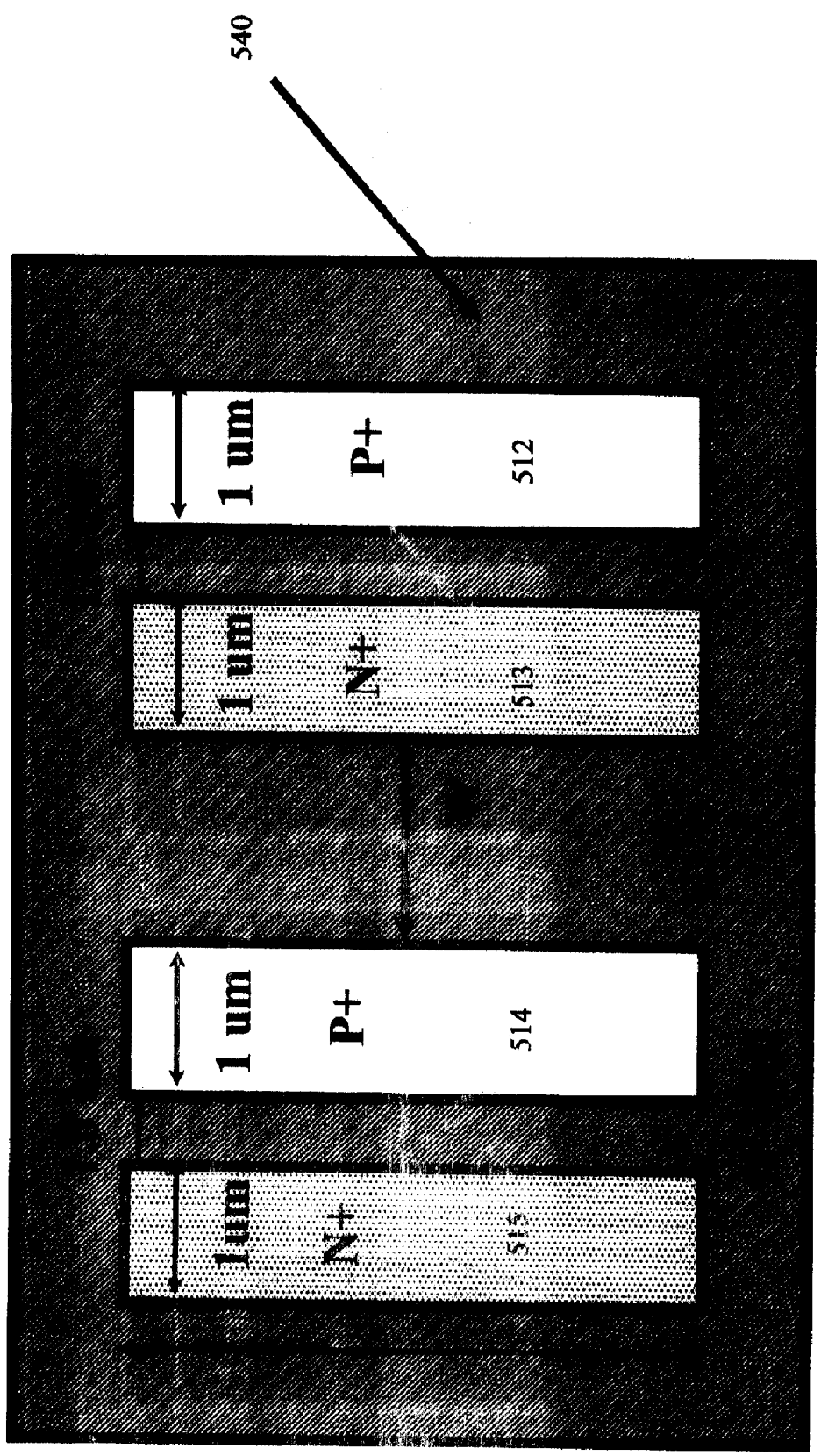
FIG. 5 illustrates a top view of a buried isolated doping region placed under an N+ well according to an embodiment of the invention.

FIG. 5 illustrates a top view of a buried isolated doping region placed under an N+ well according to an embodiment of the invention. The isolated doping region 540 is shown in a ring structure. The P+ diffusion 512 is contained in the isolated doping region 540 for a contact. The N+ diffusion 513 is also in contact. W is the spacing between the N+ region 513 and the P+ region 514.

According to an embodiment of the invention, there may be up to a three-fold gain in the device. For example, in the case of a PNP structure, or bipolar junction transistor (BJT) where the isolated doping region is placed completely under the physical structure, the shunt resistance is reduced and there is a reduction in the PNP bipolar transistor characteristics. According to an embodiment of the invention, the physical P+ diffusion may drop by as much as five times.

Figure 6:
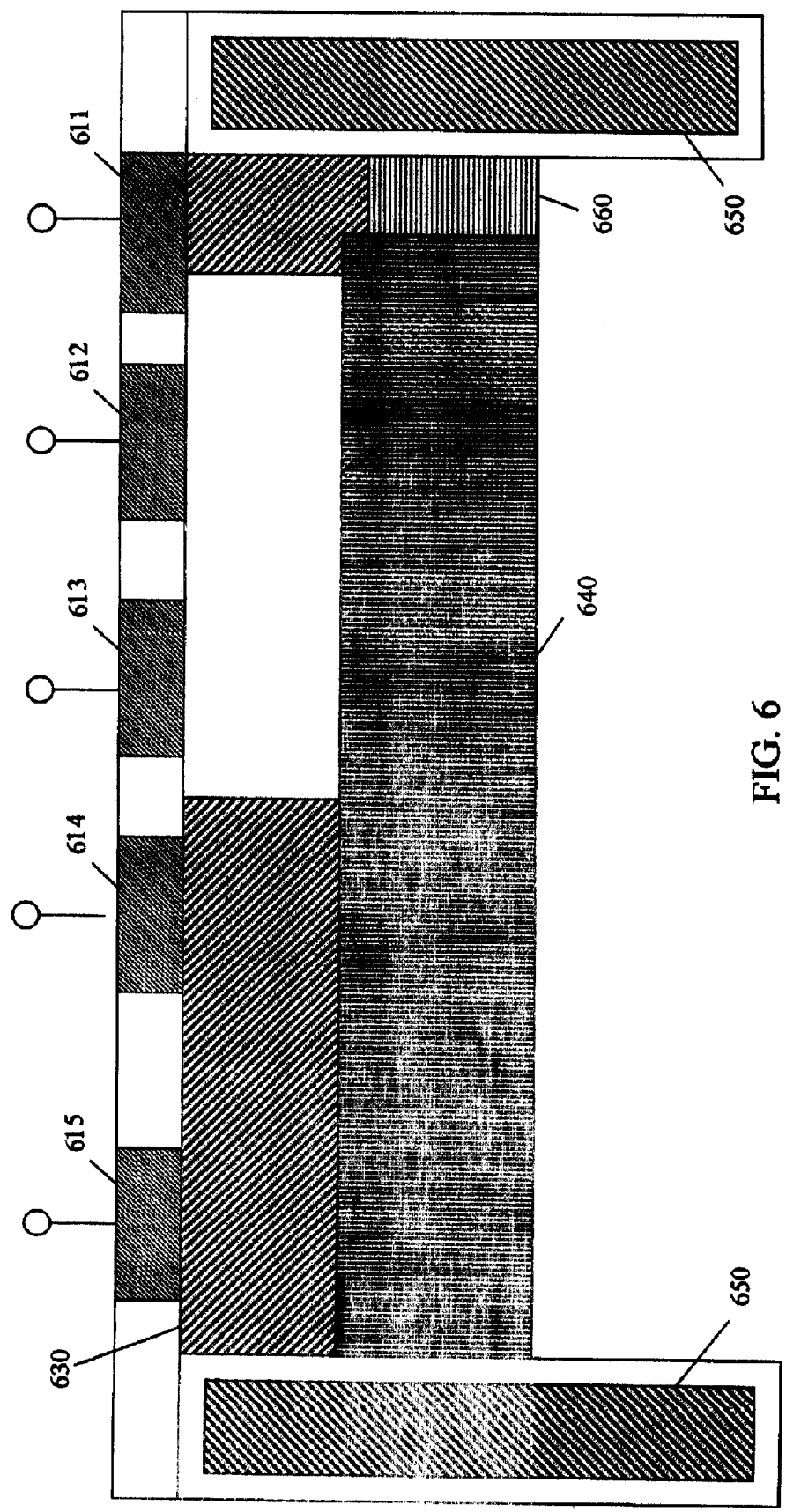
FIG. 6 illustrates a substrate having a buried isolated doping layer placed under an N+ well having a deep trench according to another exemplary embodiment of the invention.

FIG. 6 illustrates a substrate having a buried isolated doping layer placed under an N+ well having a deep trench according to another exemplary embodiment of the invention. The isolated doping region 640 has the entire physical region abutted with a trench 650 on the side wall. As illustrated, a deep trench structure 650 is provided on the outside of the isolated doping region 640, where the deep trench structure 650 is a ring around the center structure. By way of example, the deep trench structure 650 is filled with a material, such as polysilicon.

FIG. 6 also illustrates the isolated doping region 640 pulled all the way underneath the N-well 630 on one side, but also shows a P+ implant 660 under the N-well 611. Thus, the P+ implant 660 causes the isolated doping region 640 to also not abut the deep trench structure 650. According to an embodiment of the invention, the P+ implant region 660 is a heavily P+ implant which acts to limit some of the diffusion properties in the scattering phenomenon. Thus, in some cases, it may be desirable for the trench 650 to be next to the isolated doping region 640. Alternatively, the isolated doping region 640 may be located such that the P+ implant 660 is located between the region 640 and the trench 650. P+ diffusions 612 and 614, and N+ diffusions 611, 613 and 615 have similar properties to those described previously.

Latchup can be quantified based on a "trigger" and "holding" condition. A "turn-on" state occurs prior to the trigger condition. This "turn-on" state is related to a sidewall trench mechanism leading to a modulation of the latchup condition. Generally, the exemplary embodiments of the invention may utilize a CMOS structure comprising a p+ diffusion in an n-well region. This n-well is formed in a substrate region. The PNPN structure also includes an n+ region, which forms the PNPN structure.

This is formed using the trench structure in the substrate, as illustrated in FIG. 6, wherein the trench structure 650 comprises a deep trench (DT) structure or a trench isolation (TI) structure. A deep trench structure may include a structure formed early in the semiconductor process. The DT structure typically has an oxide sidewall, and is filled with polysilicon material. The DT structure also may be filled with a material, such as polysilicon, to avoid thermal stress issues. In this example, the structure can be referred to as the polysilicon-filled deep trench (DT) structure. The depth of the trench structure may range from about 4 μm to about 12 μm, for example. The deep trench structure also can be formed after epitaxial growth in a BiCMOS process.

Trench isolation (TI) is a structure which often has less cost and is implemented later in the semiconductor process. As a result, the TI structure may be formed using a contact etch process after the MOSFET and bipolar transistors are formed in a BiCMOS process. In this case, the TI structure may be filled with oxide insulator due to low thermal cycles after this process step. The oxide trench isolation structure is significantly deeper than the surface shallow trench isolation (STI) structure. The STI defines the openings for MOSFETs, bipolar and other semiconductor components. Deep trench isolation may range from about 4 to about 12 μm deep. The silicon-dioxide TI is between about 2 to about 4 μm deep and formed at the back-end-of-line (BEOL) contact etch. Shallow trench isolation varies from about 0.1 to about 0.5 μm deep, and may be formed prior completion of the MOSFET and bipolar transistors.

Figure 7:
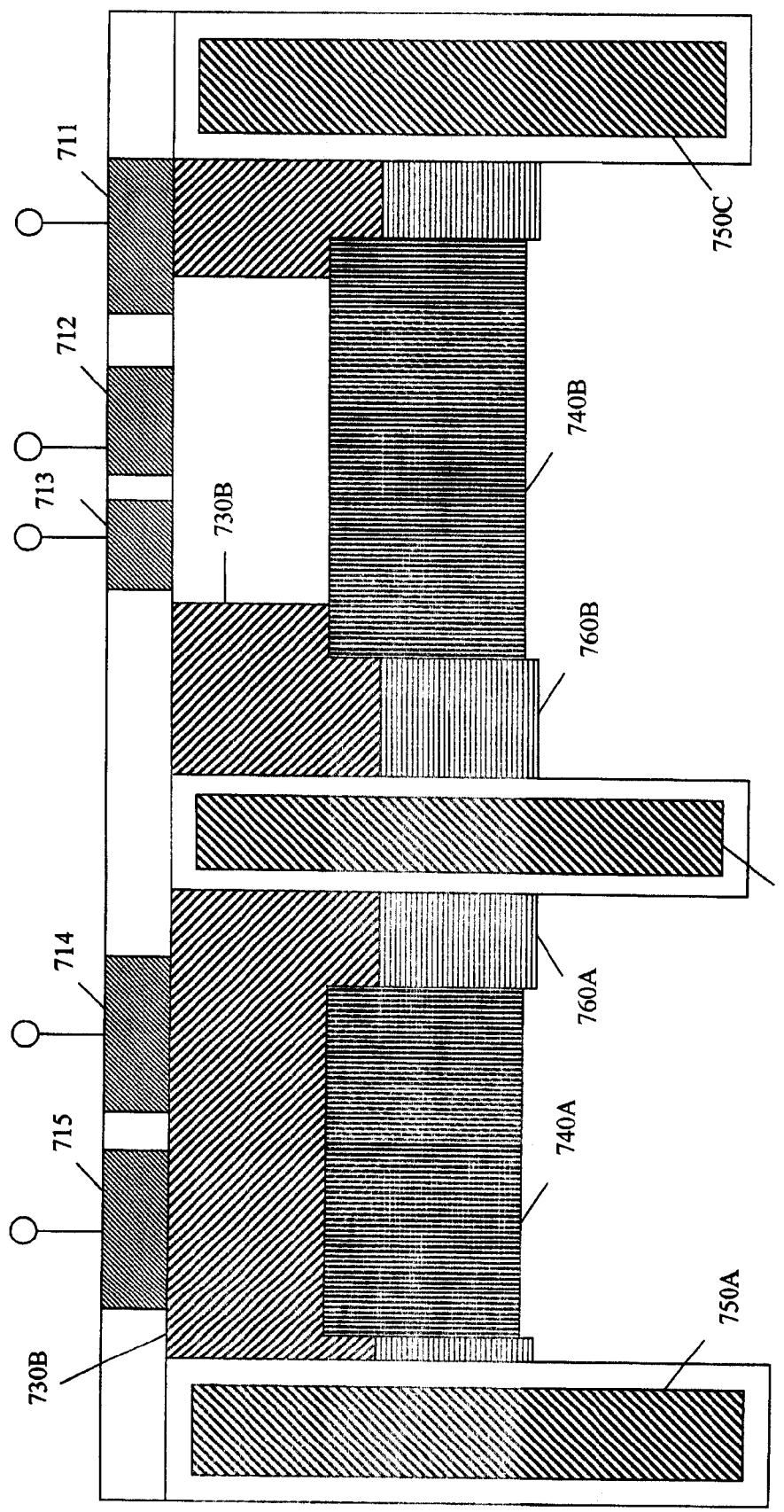
FIG. 7 illustrates a substrate having a buried isolated doping layer placed under an N+ well having a deep trench structure according to another exemplary embodiment of the invention.

FIG. 7 illustrates a substrate having a buried isolated doping layer placed under an N+ well having a deep trench structure according to an embodiment of the invention. P+ diffusions 712 and 714, and N+ diffusions 711, 713 and 715 have similar properties to those described previously. The trench structure has potion 750A, 750B and 750C, where portion 750B is located in the middle of the structure, thus dividing the N-well into portion 730A and portion 730B and the isolated doping region in portion 740A and portion 740B, and the P+ implant regions in portion 760A and portion 760B. More specifically, a portion of the trench structure 750 is located between the P+ region 714 and the N+ region 713. According to an embodiment of the invention, the deep trench structure 750 is set between the P+ region 714 and the N+ region 713, thereby reducing or eliminating the lateral PNP. The current flows from the P+ diffusion 714 through the N-well portion 730A, through the isolated doping region 740A, and down. There is no lateral NPN, and the N+ diffusion 713 cannot get to the N-well portion 730A without going through the isolated doping region 740. Thus, the structures on one side are not electrically connected to structures on the other side. The PNP is isolated on one side, the NPN is isolated on the other side. By splitting the physical region, there is separate contact on one side.

This results in a separate bias voltage situation. In this situation, the deep trench 750 is within an isolated doping region 740 with the butted structure 760, with the deep trench between the P+ diffusion 714 and the N+ diffusion 713. There is no coupled PNPN in this structure.

Figure 8:
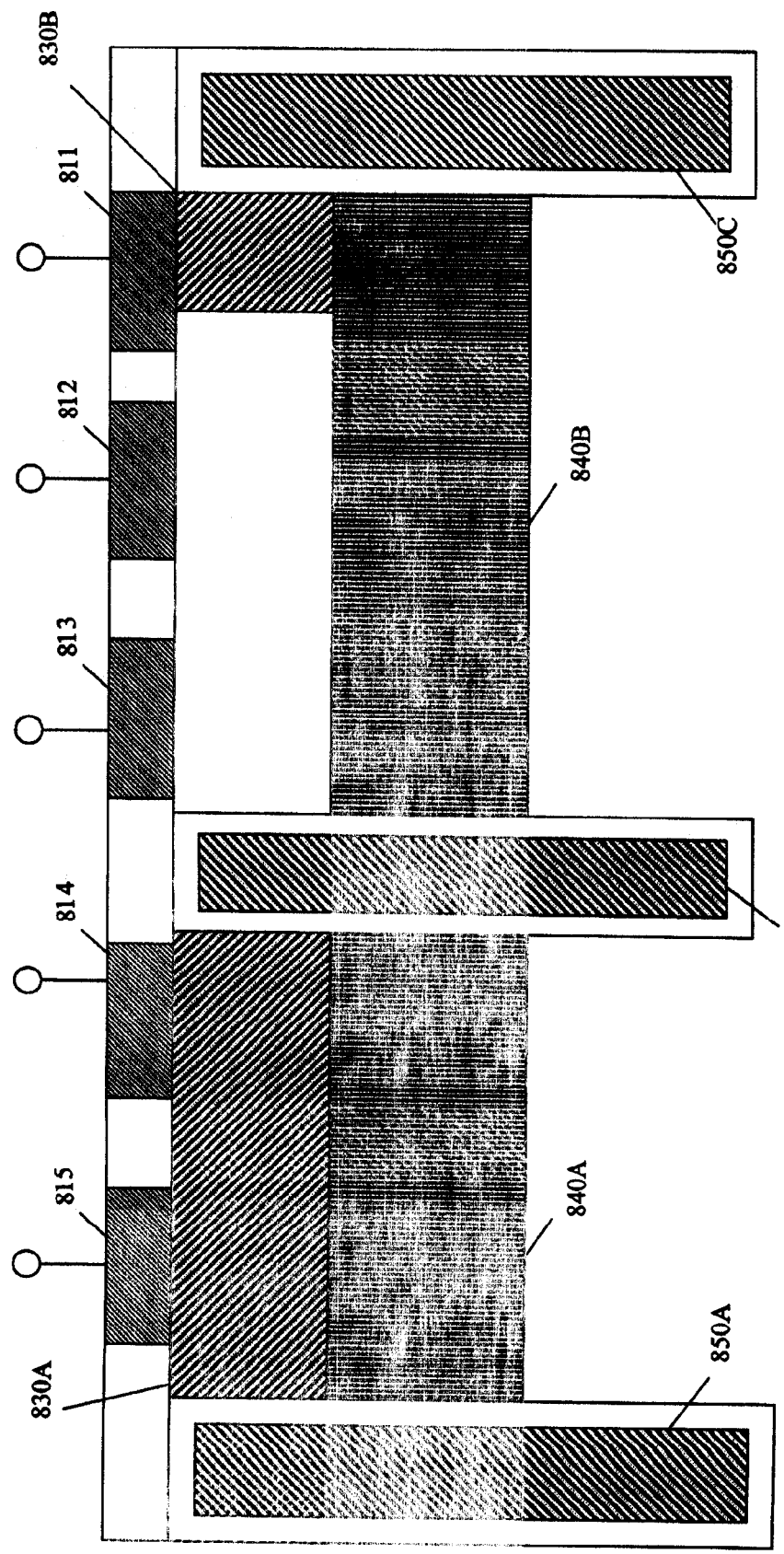
FIG. 8 illustrates a substrate having a buried isolated doping layer placed under an N+ well and abutting a deep trench within the substrate according to another exemplary embodiment of the invention.

FIG. 8 illustrates a substrate having a buried isolated doping layer placed under an N+ well and abutting a deep trench within the substrate according to another exemplary embodiment of the invention. P+ diffusions 812 and 814, N+ diffusions 811, 813 and 815, N-well 830, isolating doping regions having portion 840A and portion 840B and trench structures having portion 850A, portion 850B and portion 850C have similar properties to those described previously.

According to an embodiment of the invention, the function of the structures on the left hand side, as shown in FIG. 8, serves as a deeper well and reduces or eliminates the series resistance of the PNP. The right hand side (i.e., the portions of the structure to the right of trench structure potion 850B) has a collector region which is isolated from the left hand side. The trench structure 850B in the middle minimizes or eliminates lateral PNP, minimizes or eliminates lateral NPN effects, and separates the isolated doped region its portions 840 and 840B. The structure on the left hand side is isolated electrically from the right hand side, and the N-well region 830A is not electrically connected to the N-well region 830B. The separate physical spaces have commonality to the form latchups.

Additionally, by combining the deep trench (DT) structure with the buried layer, the isolated p-well region is separated from the n-well and the p– substrate. This allows separate biasing and electrical isolation of the structure. According to an embodiment of the invention, allowing the deep trench to abut the buried layer allows for elimination of a spacing between the buried layer and the deep trench structure.

Figure 9:
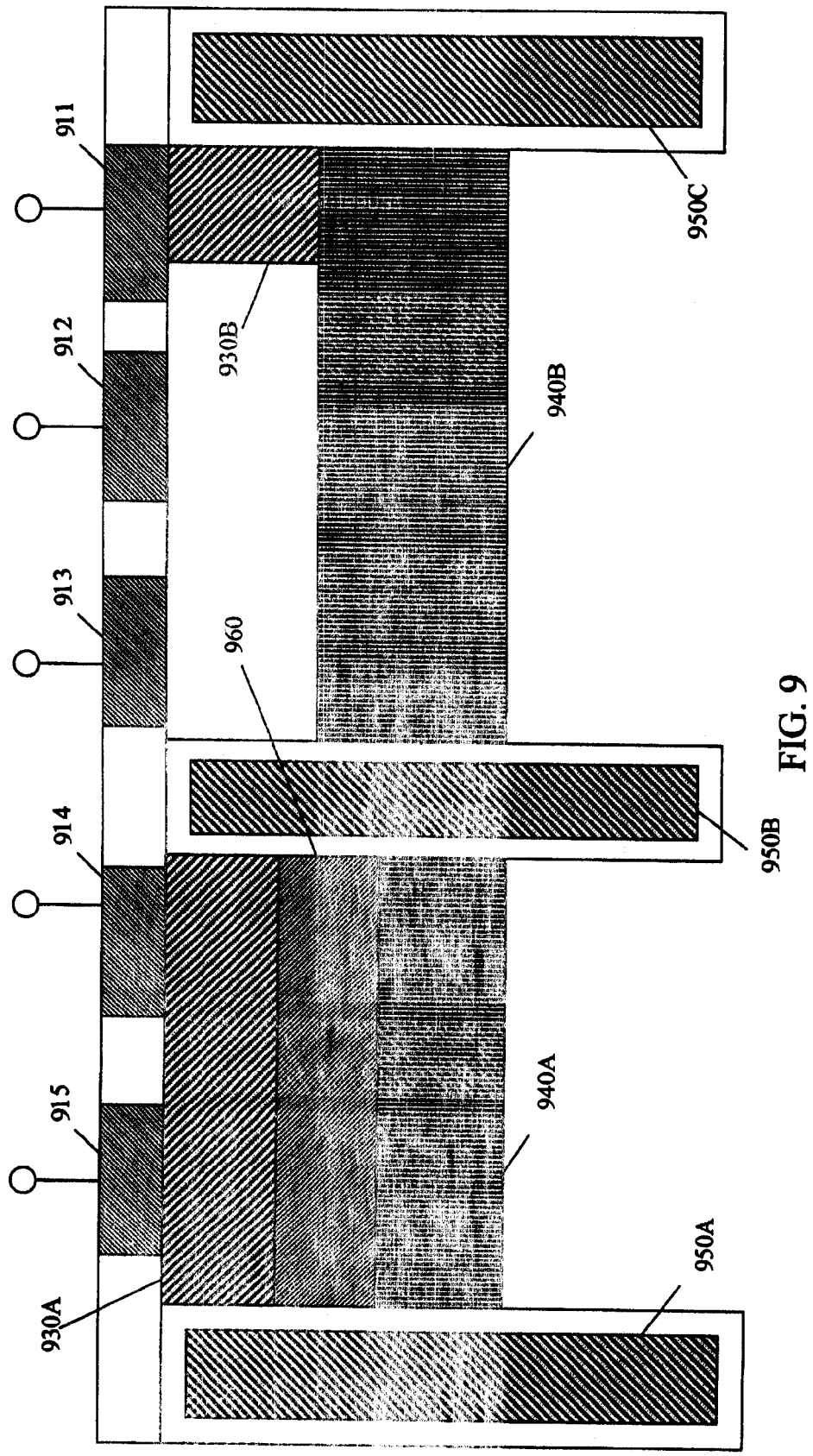
FIG. 9 illustrates a substrate having a buried isolated doping layer placed under an N+ well having a deep trench and a sub-collector according to another exemplary embodiment of the invention.

FIG. 9 illustrates a substrate having a buried isolated doping layer placed under an N+ well having a deep trench and a sub-collector according to another exemplary embodiment of the invention. A BiCMOS sub-collector implant 960 is placed under the n-well region 930. Adding a sub-collector region in the n-well lowers the vertical parasitic gain, and decreases the shunt resistance in the n-well. This arrangement lowers the latchup susceptibility of the structure. P+ diffusions 912 and 914, N+ diffusions 911, 913 and 915, N-well portions 930A ad 930B, isolating doping region portions 940A and 940B and trench structure portions 950A, 950B and 950C have similar properties to those described previously.

One embodiment of the invention allows an n-buried layer to be placed under the n-well region that contains p-type devices. In this fashion, no minimum overlap space is required between the n-well and the buried layer. An advantage of allowing the buried layer to be placed under the n-well is that there is no minimum overlap requirement. This allows for a minimum p+/n+ spacing for dense designs.

According to a further embodiment of the invention, the n-buried layer is placed under the n-well region that contains the p-type devices, and extends beyond the p-type devices into the n-well contact region. In this fashion, no minimum separation space is required between the p-devices and the buried layer. By allowing the buried layer to be placed under the n-well, and under the p-devices, there is no separation spacing requirement. Allowing the buried layer to extend to the n-well contact may decrease the shunt resistance from the n-well contact to the p-channel device and thereby lead to an increase in the latchup robustness. This may increase the latchup margin of the technology.

While the invention has been described in terms of exemplary embodiments, those skilled in the art will recognize that the invention can be practiced with modifications and in the spirit and scope of the appended claims.

What is claimed is:

1. A structure comprising:
   a substrate of a first polarity;
   a well region of a second polarity below said substrate;
   a semiconductor device comprising at least one implant of the first polarity above said well region;
   an ohmic contact for said well region; and
   a dopant layer of the second polarity below the substrate, the dopant layer abutting the well region and placed under said semiconductor device,
   wherein said dopant layer edge is overlapped with said well region to avoid ion scattering impact,
   wherein said dopant layer is adapted to suppress latch-up, wherein the dopant layer and the well region of the second polarity provide an isolated region of the first polarity, and
   wherein the isolated region is surrounded by at least the dopant layer, the well region and the substrate.

2. The structure of claim 1, wherein the dopant layer extends under the ohmic contact region.

3. The integrated circuit of claim 1, further comprising a trench structure.

4. The structure of claim 3, wherein the trench structure is a deep trench (DT) structure.

5. The structure of claim 3, wherein the trench structure is trench isolation (TI) structure.

6. The structure of claim 1, further comprising sub-collector of the second polarity contained within the well region.

7. The structure of claim 3, further comprising sub-collector abutting said trench structure.

8. A structure comprising:
   a substrate of a first polarity;
   a well region of a second polarity below said substrate;
   a semiconductor device comprising at least one implant of the first polarity above said well region;
   an ohmic contact for said well region; and
   a dopant layer of the second polarity below the substrate, the dopant layer abutting the well region and placed under said semiconductor device under the ohmic contact region, said dopant layer suppresses latch-up and the dopant layer and the well region of the second polarity provide an isolated region of the first polarity,
   wherein the isolated region is surrounded by at least the dopant layer, the well region and the substrate.

9. The structure of claim 8, further comprising a trench structure that is a deep trench (DT) structure.

10. The structure of claim 8, further comprising a trench structure that is a trench isolation (TI) structure.

11. The structure of claim 8, further comprising sub-collector of the second polarity contained within the well region.

12. The structure of claim 11, further comprising sub-collector abutting said trench structure.

13. The structure of claim 3, wherein the trench structure contacts the well region.

14. The structure of claim 13, wherein the trench structure contacts the dopant layer.

15. The structure of claim 9, wherein the deep trench structure contacts the well region.

16. The structure of claim 15, wherein the deep trench structure contacts the dopant layer.

17. The structure of claim 1, wherein the isolated region is arranged between the substrate and the dopant layer.

18. The structure of claim 8, wherein the isolated region is arranged between the substrate and the dopant layer.

* * * * *